US010943968B2

(12) United States Patent
Lee et al.

(10) Patent No.: US 10,943,968 B2
(45) Date of Patent: Mar. 9, 2021

(54) ORGANIC LIGHT-EMITTING DISPLAY DEVICE

(71) Applicant: Samsung Display Co., Ltd., Yongin-si (KR)

(72) Inventors: So Hyun Lee, Hwaseong-si (KR); Deok Young Choi, Suwon-si (KR)

(73) Assignee: Samsung Display Co., Ltd.

( * ) Notice: Subject to any disclaimer, the term of this patent is extended or adjusted under 35 U.S.C. 154(b) by 91 days.

(21) Appl. No.: 15/717,757

(22) Filed: Sep. 27, 2017

(65) Prior Publication Data

US 2018/0108721 A1    Apr. 19, 2018

(30) Foreign Application Priority Data

Oct. 13, 2016 (KR) .................. 10-2016-0132601

(51) Int. Cl.

| | |
|---|---|
| G09G 3/32 | (2016.01) |
| H01L 27/32 | (2006.01) |
| H01L 51/56 | (2006.01) |
| G02F 1/061 | (2006.01) |
| G02F 1/13 | (2006.01) |
| G06F 3/03 | (2006.01) |
| G09G 3/3233 | (2016.01) |
| G09G 3/3275 | (2016.01) |
| G09G 3/3266 | (2016.01) |

(52) U.S. Cl.
CPC ....... *H01L 27/3276* (2013.01); *G09G 3/3233* (2013.01); *G09G 3/3266* (2013.01); *G09G 3/3275* (2013.01); *G09G 2300/043* (2013.01); *G09G 2300/0819* (2013.01); *G09G 2320/0223* (2013.01); *G09G 2320/045* (2013.01); *G09G 2330/028* (2013.01); *G09G 2330/12* (2013.01); *G09G 2360/145* (2013.01)

(58) Field of Classification Search
CPC ............ H01L 27/3276; H01L 27/3251; G09G 3/3225–3433; G09G 3/3208; G09G 3/3291; G09G 2300/043–0819; G09G 2320/0223–045; G09G 2330/028; G09G 2330/12; G09G 2360/145; G06F 3/03545; G02F 1/061–01345
See application file for complete search history.

(56) References Cited

U.S. PATENT DOCUMENTS

| 8,797,491 B2 | 8/2014 | Kim et al. | |
|---|---|---|---|
| 2002/0011976 A1* | 1/2002 | Hashimoto | G09G 3/3233 345/76 |
| 2004/0051836 A1* | 3/2004 | Jung | G02F 1/1345 349/149 |

(Continued)

FOREIGN PATENT DOCUMENTS

| KR | 1014204790000 | 7/2014 |
|---|---|---|
| KR | 1015931030000 | 2/2016 |

*Primary Examiner* — Lin Li

(74) *Attorney, Agent, or Firm* — Innovation Counsel LLP

(57) ABSTRACT

An organic light-emitting display device is provided. The organic light-emitting display device comprises a plurality of data lines, first and second sensing lines disposed on a same layer as the data lines, an insulating layer disposed on the data lines and the first and second sensing lines, and a power line disposed on the insulating layer. An area of overlap between the first sensing line and the power line is the same as an area of overlap between the second sensing line and the power line.

16 Claims, 12 Drawing Sheets

(56) References Cited

U.S. PATENT DOCUMENTS

| | | | | |
|---|---|---|---|---|
| 2006/0113903 A1* | 6/2006 | Kim | ................... | H01L 27/3251 313/506 |
| 2006/0123293 A1* | 6/2006 | Kim | ................... | G09G 3/3291 714/724 |
| 2006/0146038 A1* | 7/2006 | Park | ................... | G06F 3/042 345/173 |
| 2008/0036387 A1* | 2/2008 | Jung | ................... | H01L 27/3276 315/169.3 |
| 2011/0018858 A1* | 1/2011 | Ryu | ................... | G09G 3/3291 345/213 |
| 2012/0026144 A1* | 2/2012 | Kang | ................... | G09G 3/3225 345/211 |
| 2012/0104401 A1* | 5/2012 | Kubota | ................ | H01L 27/326 257/59 |
| 2013/0010240 A1* | 1/2013 | Moriwaki | ............. | G02F 1/1339 349/106 |
| 2013/0027648 A1* | 1/2013 | Moriwaki | ............. | G02F 1/1345 349/138 |
| 2013/0106817 A1* | 5/2013 | Gang | ................... | G02F 1/061 345/211 |
| 2014/0117320 A1* | 5/2014 | Jung | ................... | H01L 27/3276 257/40 |
| 2014/0168290 A1* | 6/2014 | Yang | ................... | G09G 3/3233 345/691 |
| 2014/0353616 A1* | 12/2014 | Park | ................... | G09G 3/3208 257/40 |
| 2015/0029171 A1* | 1/2015 | Jo | ................... | G09G 3/3258 345/212 |
| 2015/0187279 A1* | 7/2015 | Lee | ................... | H01L 51/56 257/40 |
| 2015/0206933 A1* | 7/2015 | Koshihara | ........... | H01L 27/3262 257/40 |
| 2015/0212634 A1* | 7/2015 | Pyun | ................... | G06F 3/03545 345/173 |
| 2016/0163265 A1* | 6/2016 | Yang | ................... | G09G 3/3233 345/690 |
| 2016/0253024 A1* | 9/2016 | Aoyama | ............... | G06F 3/0416 345/174 |

* cited by examiner

ORGANIC LIGHT-EMITTING DISPLAY DEVICE

This application claims priority to Korean Patent Application No. 10-2016-0132601, filed on Oct. 13, 2016, and all the benefits accruing therefrom under 35 U.S.C. § 119, the disclosure of which is incorporated herein by reference in its entirety.

BACKGROUND

1. Field

The present disclosure relates to an organic light-emitting display device.

2. Description of the Related Art

Examples of a display device include a liquid crystal display (LCD) device, a field emission display (FED) device, a plasma display panel (PDP), and an organic light-emitting display device.

The organic light-emitting display device displays an image using an organic light-emitting diode (OLED), which generates light by recombining electrons and holes. The organic light-emitting display device has advantages of fast response speed and low power consumption. The organic light-emitting display device displays a desired image by supplying a current corresponding to a particular gray level to the OLED, which is provided for each pixel PX. However, the OLED deteriorates over time, and as a result, an image with a desired luminance may not be able to be displayed. In fact, as the OLED deteriorates, the luminance of light generated according to any given data signal gradually decreases.

In order to overcome this problem, a method has been suggested in which deterioration information of the OLED is extracted from each pixel and data is modified based on the extracted deterioration information to compensate for the deterioration of the OLED.

However, when the deterioration information of the OLED is extracted using a conventional method, an error may be included in the extracted deterioration information due to differences in resistive-capacitive (RC) delay among wirings of fan-out portions of the organic light-emitting display device, and as a result, the reliability of the extracted deterioration information may decrease.

SUMMARY

Exemplary embodiments of the present disclosure provide an organic light-emitting display device capable of improving the reliability of deterioration information by minimizing differences in resistive-capacitive (RC) delay among fan-out wirings.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, there is provided an organic light-emitting display device. The organic light-emitting display device comprises a plurality of data lines, first and second sensing lines disposed on a same layer as the data lines, an insulating layer disposed on the data lines and the first and second sensing lines, and a power line disposed on the insulating layer. An area of overlap between the first sensing line and the power line is the same as an area of overlap between the second sensing line and the power line.

According to another exemplary embodiment of the present disclosure, there is provided an organic light-emitting display device. The organic light-emitting display device comprises a plurality of data lines, first and second sensing lines disposed on a same layer as the data lines, an insulating layer disposed on the data lines and the first and second sensing lines, and a power line disposed on the insulating layer. The second sensing line extends to be bent, the first sensing line extends in one direction, and the power line has a wider width in a direction perpendicular to a direction in which the power line extends in a region of overlap between the first sensing line and the power line than in a region of overlap between the second sensing line and the power line.

According to the aforementioned and other exemplary embodiments of the present disclosure, an organic light-emitting display device capable of improving the reliability of deterioration information by minimizing differences in RC delay among fan-out wirings can be provided.

Other features and exemplary embodiments may be apparent from the following detailed description, the drawings, and the claims.

BRIEF DESCRIPTION OF THE DRAWINGS

The above and other exemplary embodiments and features of the present disclosure will become more apparent by describing in detail exemplary embodiments thereof with reference to the attached drawings, in which.

DETAILED DESCRIPTION

Figure 1:
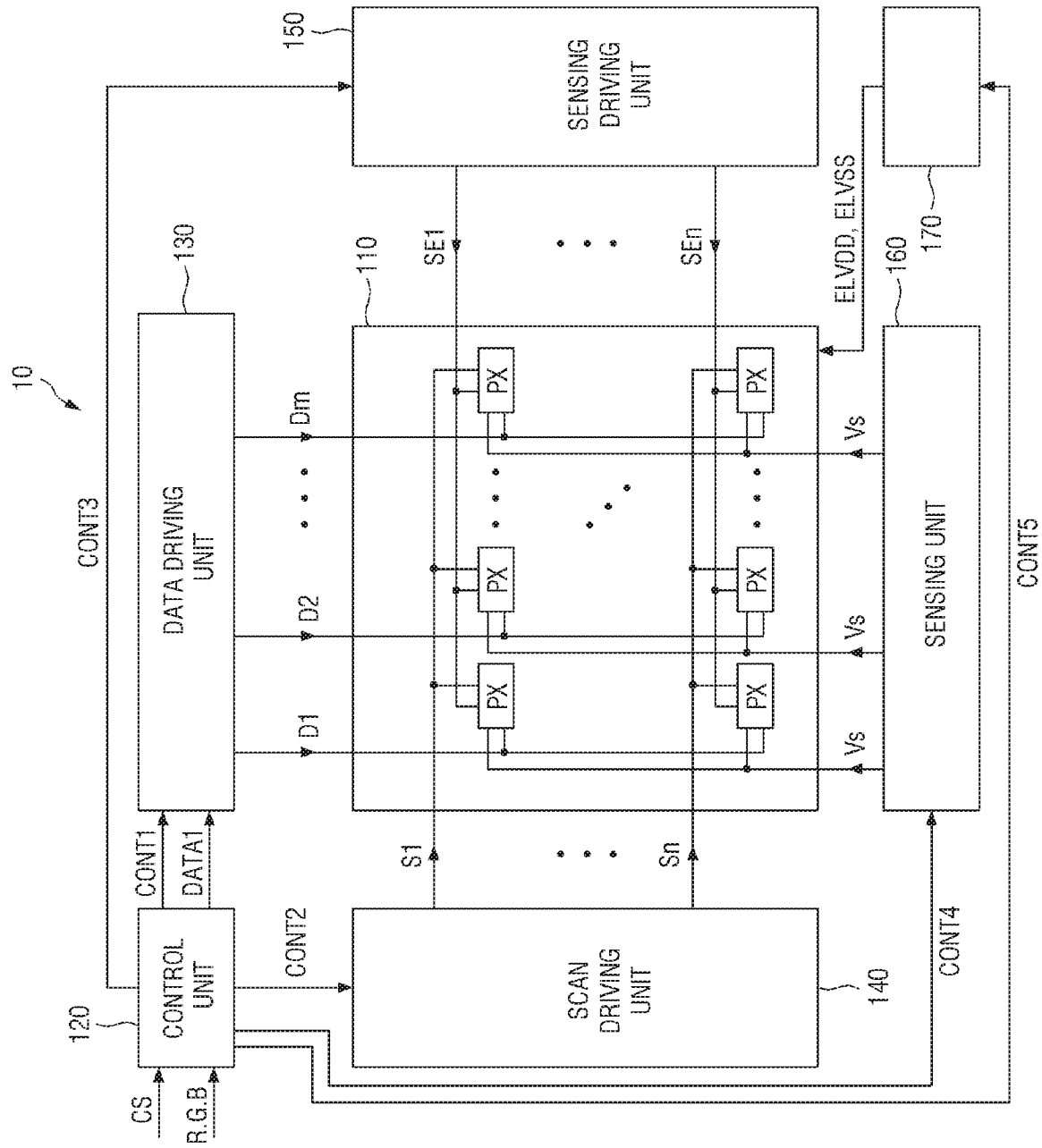
FIG. 1 is a block diagram of an organic light-emitting display device according to an exemplary embodiment of the present disclosure.

The inventive concept will now be described more fully hereinafter with reference to the accompanying drawings, in which embodiments are shown. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the inventive concept.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

In an embodiment, an electronic apparatus may be any apparatus provided with a display device. Examples of the electronic apparatus may include smart phones, mobile phones, navigators, game machines, TVs, car head units, notebook computers, laptop computers, tablet computers, personal media players (PMPs), and personal digital assistants (PDAs). The electronic apparatus may be embodied as a pocket-sized portable communication terminal having a wireless communication function. Further, the display device may be a flexible display device capable of changing its shape.

Hereinafter, embodiments will be described with reference to the attached drawings.

Figure 2:
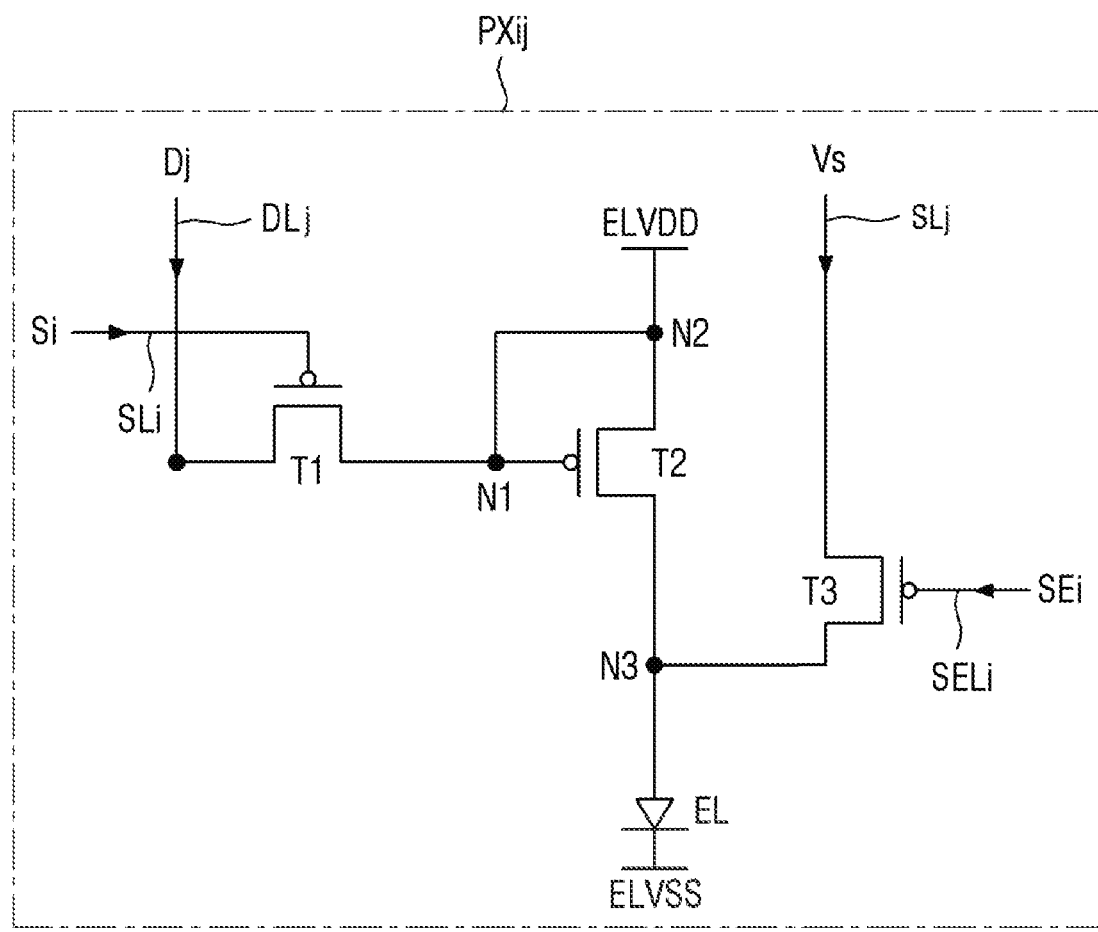
FIG. 2 is a circuit diagram of a pixel of the organic light-emitting display device of FIG. 1.

FIG. 1 is a block diagram of an organic light-emitting display device 10 according to an exemplary embodiment of the present disclosure, and FIG. 2 is a circuit diagram of a pixel of the organic light-emitting display device 10 of FIG. 1.

Referring to FIGS. 1 and 2, the organic light-emitting display device 10 includes a display unit 110, a control unit 120, a data driving unit 130, a scan driving unit 140, a sensing driving unit 150, a sensing unit 160, and a power supply unit 170.

The display unit 110 may be a region in which to display an image. The display unit 110 may include a plurality of scan lines, a plurality of data lines, which intersect the scan lines, and a plurality of pixels PX, which are connected to the scan lines and the data lines. The pixels PX may be arranged in a matrix. The data lines may extend in a row direction in which the number of rows increases, and the scan lines may extend in a column direction in which the number of columns increases. The display unit 110 may further include a plurality of power lines, a plurality of sensing lines, and a plurality of sensing control lines. The power lines, the sensing lines, and the sensing control lines may be connected to the pixels PX.

The control unit 120 may receive a control signal CS and an image signal "R, G, B". The image signal "R, G, B" may include luminance information of the pixels PX.

The luminance information may include a predefined number of gray levels, for example, 1024, 256 or 64 gray levels. Examples of the control signal CS include a vertical synchronization signal Vsync, a horizontal synchronization signal Hsync, a data enable signal DE, and a clock signal CLK. The control unit 120 may generate first through fifth driving control signals CONT1 through CONT5 and image data DATA according to the image signal "R, G, B" and the control signal CS. The control unit 120 may compensate for the image data DATA, and may transmit compensated image data DATA1 to the data driving unit 130 together with the first driving control signal CONT1. The generation of the compensated image data DATA1 will be described later in further detail. The control unit 120 may transmit the second driving control signal CONT2 to the scan driving unit 140, the third driving control signal CONT3 to the sensing driving unit 150, the fourth driving control signal CONT4 to the sensing unit 160, and the fifth driving control signal CONT5 to the power supply unit 170.

The scan driving unit 140 may be connected to the scan lines of the display unit 110 and may generate a plurality of scan signals S1, S2, . . . , Sn according to the second driving control signal CONT2. The scan driving unit 140 may sequentially apply the scan signals S1, S2, . . . , Sn having a gate-on voltage to the scan lines, respectively.

The data driving unit 130 may be connected to the data lines of the display unit 110 and may generate a plurality of data voltages D1, D2, . . . , Dm by sampling and holding the compensated image data DATA1 input thereto according to the first driving control signal CONT1 and converting the sampled-and-held image data into analog voltage data. The data driving unit 130 may transmit the data voltages D1, D2, . . . , Dm to the data lines, respectively. Each of the pixels PX of the display unit 110 may be turned on by one of the scan signals S1, S2, . . . , Sn having the gate-on voltage and may be provided with one of the data voltages D1, D2, . . . , Dm.

The sensing unit 160 may generate a sensing voltage Vs having a predetermined level according to the fourth driving control signal CONT4 and may provide the sensing voltage Vs to the pixels PX. The sensing voltage Vs may drive an organic light-emitting diode (OLED) included in each of the pixels PX at a predetermined gray level. The sensing unit 160 may transmit the sensing voltage Vs to the sensing lines, but the present disclosure is not limited thereto. That is, alternatively, the sensing unit 160 may transmit the sensing voltage Vs to the pixels PX via the data lines, in which case, lines via which the data voltages D1, D2, . . . , Dm are output may be disconnected from the data lines.

The power supply unit 170 may supply a first power supply voltage ELVDD and a second power supply voltage ELVSS to the power lines connected to the pixels PX. The first power supply voltage ELVDD and the second power supply voltage ELVSS may generate a driving current for each of the pixels PX. The power supply unit 170 may determine the first power supply voltage ELVDD according to the fifth driving control signal CONT5. That is, the first power supply voltage ELVDD may differ from an ordinary driving mode of the organic light-emitting display device 10 to a sensing mode of the organic light-emitting display device 10 in which to read out deterioration information, and this will be described later in further detail.

The sensing driving unit 150 may determine the levels of sensing control signals SE1, SE2, . . . , SEn according to the third driving control signal CONT3 and may provide the sensing control signals SE1, SE2, . . . , SEn to the sensing control lines, respectively, connected to the pixels PX. The sensing driving unit 150 may sequentially provide the sensing control signals SE1, SE2, . . . , SEn to the sensing control lines, respectively, connected to the pixels PX.

FIG. 2 illustrates the structure of one of the pixels PX included in the display unit 110. Specifically, FIG. 2 illustrates the structure of a pixel PXij connected to an i-th scan line SLi and a j-th data line DLj, but the structure of the pixels PX is not particularly limited.

Referring to FIG. 2, the pixel PXij may include a first transistor T1, a second transistor T2, a third transistor T3, a first capacitor C1, and an OLED "EL".

The first transistor T1 may include a gate electrode connected to the i-th scan line SLi, a first electrode connected to the j-th data line DLj, and a second electrode connected to a first node N1. The first transistor T1 may be turned on by an i-th scan signal Si of the gate-on voltage, which is applied to the i-th scan line SLi, and may transmit a j-th data voltage Dj, which is applied to the j-th data line DLj, to the first node N1. The first transistor T1 may be a switching transistor selectively providing the j-th data voltage Dj to a driving transistor, e.g., the second transistor T2. The first transistor T1 may be a p-channel field effect transistor (FET). That is, the first transistor T1 may be turned on by a low-level scan signal and may be turned off by a high-level scan signal, but the present disclosure is not limited thereto.

The second transistor T2 may include a gate electrode connected to the first node N1, a first electrode connected to a second node N2, and a second electrode connected to a third node N3. The second node N2 may be connected to the first power supply voltage ELVDD. The first capacitor C1 may be located between the first node N1 and the second node N2. The first capacitor C1 may be charged with a data voltage provided by the first transistor T1, and the data voltage that the first capacitor C1 is charged with may be provided to the gate electrode of the second transistor T2. An anode electrode of the OLED "EL" may be connected to the third node N3. The second transistor T2 may be a driving transistor, and may control a driving current applied from the first power supply voltage ELVDD to the OLED "EL" according to the voltage of the first node N1.

The third transistor T3 may include a gate electrode connected to a sensing control line SELi, a first electrode connected to a j-th sensing line SLj, and a second electrode connected to the third node N3. The third transistor T3 may be turned on by an i-th sensing control signal SEi of the gate-on voltage, which is applied to the i-th sensing control line SELi. The third transistor T3 may be a sensing transistor. That is, the sensing voltage Vs may be supplied to the third node N3 via the third transistor T3. That is, in the sensing mode, the third transistor T3 may be turned on to supply the sensing voltage Vs, which is supplied via the j-th sensing line SLj to the third node N3.

The OLED "EL" may include an anode electrode connected to the third node N3, a cathode electrode connected to the second power supply voltage ELVSS, and an organic light-emitting layer (not illustrated). The organic light-emitting layer may emit one of primary colors. The primary colors may be red, green, and blue. A desired color may be displayed by the spatial or temporal sum of these three primary colors. The organic light-emitting layer may comprise a low- or high-molecular organic material corresponding to each color. The low- or high-molecular organic material may emit light according to the amount of current flowing through the organic light-emitting layer.

Figure 3:
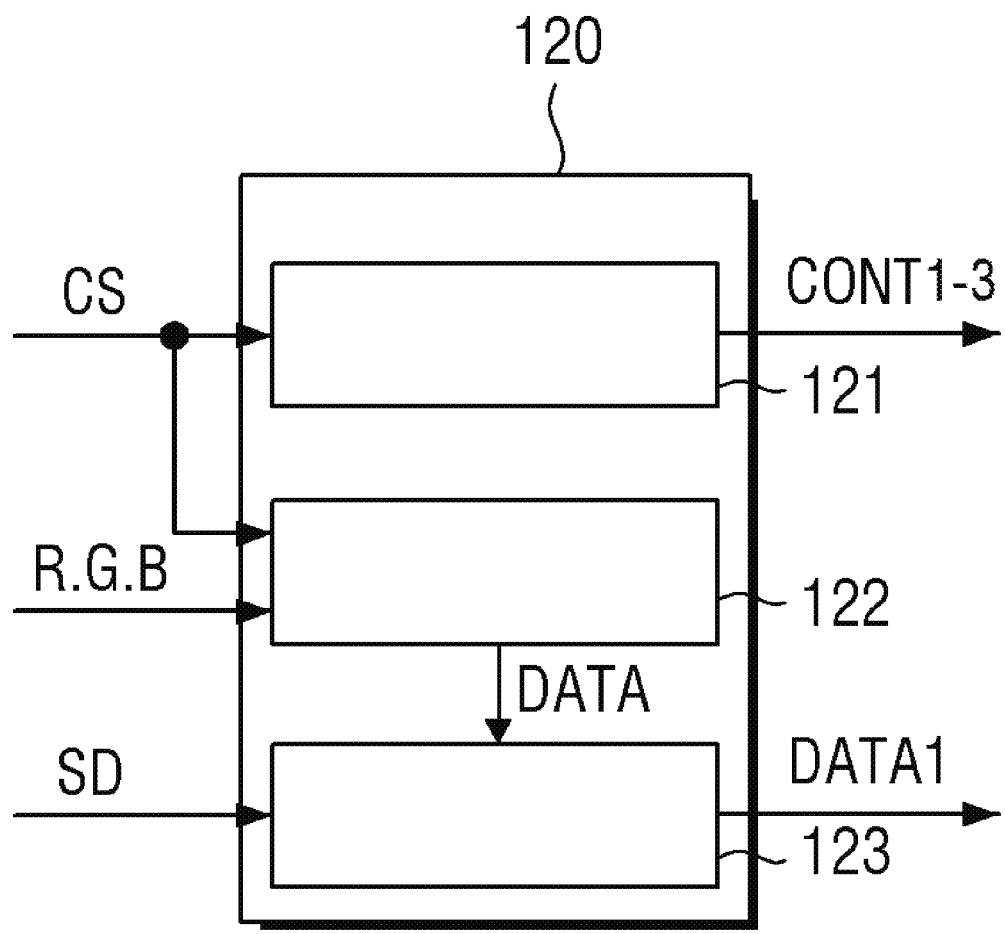
FIG. 3 is a block diagram of a control unit illustrated in FIG. 1.

FIG. 3 is a block diagram of the control unit 120 illustrated in FIG. 1.

Referring to FIG. 3, the control unit 120 may generate the compensated image data DATA1 by compensating the image data DATA using sensing data SD provided by the sensing unit 160.

The sensing data SD is data read from the sensing unit 160, and various methods may be used to detect the sensing data SD. That is, the luminance of the OLED "EL" may be measured, but the present disclosure is not limited thereto. The sensing data SD may be read by directly measuring a current or a voltage flowing through the OLED "EL". The sensing unit 160 may convert the read sensing data SD into a digital value. The digital value generated in each of the pixels PX may be mapped by a memory unit (not illustrated) and may be provided to the control unit 120 as the sensing data SD.

The control unit 120 includes a signal processor 121, which generates the first through third driving signals CONT1 through CONT3, an image processor 122, which generates the image data DATA by processing the image signal "R, G, B", and an image compensator 123, which compensates for the image data DATA. The image compensator 123 may generate the compensated image data DATA1 using the sensing data SD provided by the sensing unit 160 and the image data DATA provided by the image processor 122. The compensated image data DATA1 may be image data having the deterioration of the OLED "EL" of each of the pixels PX compensated for. The image compensator 123, sometimes called the image compensating unit 123, may generate the compensated image data DATA1 by compensating for the image data DATA such that a higher voltage can be applied to deteriorated pixels than to non-deteriorated pixels according to luminance decreases caused by the deterioration of the OLEDs "EL" of the deteriorated pixels.

However, as described above, an error may occur in the sensing data SD due to differences in resistive-capacitive (RC) delay among fan-out wirings. Specifically, the error in the sensing data SD may be amplified while the read sensing data SD is being converted into a digital value and being mapped by the memory unit. In order to minimize the error in the sensing data SD, the RC delay differences among the fan-out wirings need to be minimized. More specifically, since the error in the sensing data SD is highly sensitive to inter-wiring RC delays, the RC delay differences among the fan-out wirings need to be reduced to almost zero such that there are substantially no RC delay differences among the fan-out wirings, and this will hereinafter be described.

Figure 4:
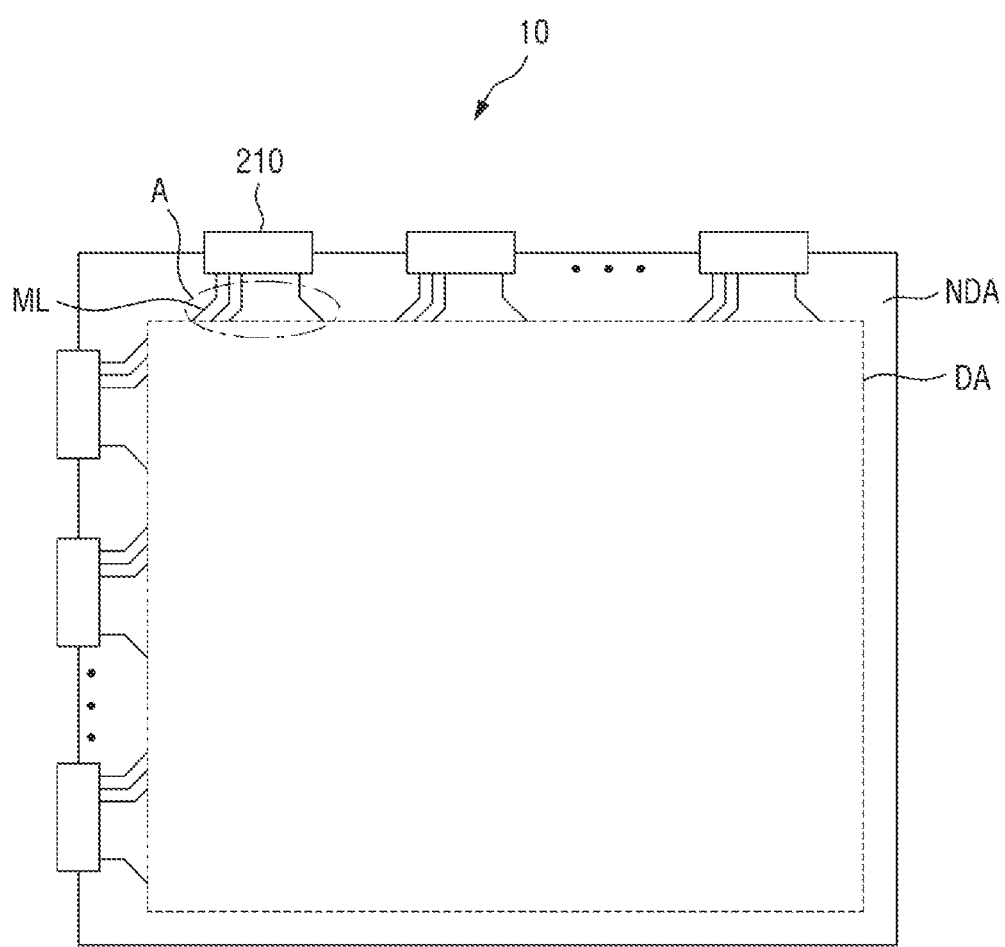
FIG. 4 is a schematic layout view of the organic light-emitting display device of FIG. 1.

FIG. 4 is a schematic layout view of the organic light-emitting display device 10 of FIG. 1.

Referring to FIG. 4, the organic light-emitting display device 10 physically includes a display area DA and a non-display area NDA.

The display area DA is an area in which an image is actually displayed to be visible to a user. In the display area DA, the pixels PX are arranged.

The non-display area NDA is an area in which an image is not displayed but elements for displaying an image in the display area DA are disposed. The non-display area NDA may be formed to surround the display area DA.

In the non-display area NDA, a plurality of pad portions PR are disposed, and in the pad portions PR, integrated circuits (ICs) (not illustrated) performing the functions of the control unit 120, the data driving unit 130, the scan driving unit 140, the sensing driving unit 150, and the sensing unit 160 are disposed. Also, in the non-display area NDA, a plurality of conductive lines ML for providing signals applied to the pad portions PR to the pixels PX in the display area DA are disposed. The conductive lines ML may extend from the pad portions PR to the display area DA to form a fan shape. Examples of the conductive lines ML include data lines DL, scan lines SL, sensing control lines SEL, sensing lines VsL, and a power line POL. However, the shape formed by the conductive lines ML is not particularly limited. That is, the conductive lines ML may form various shapes other than the fan shape, and this will hereinafter be described with reference to FIGS. 5 and 6.

Figure 5:
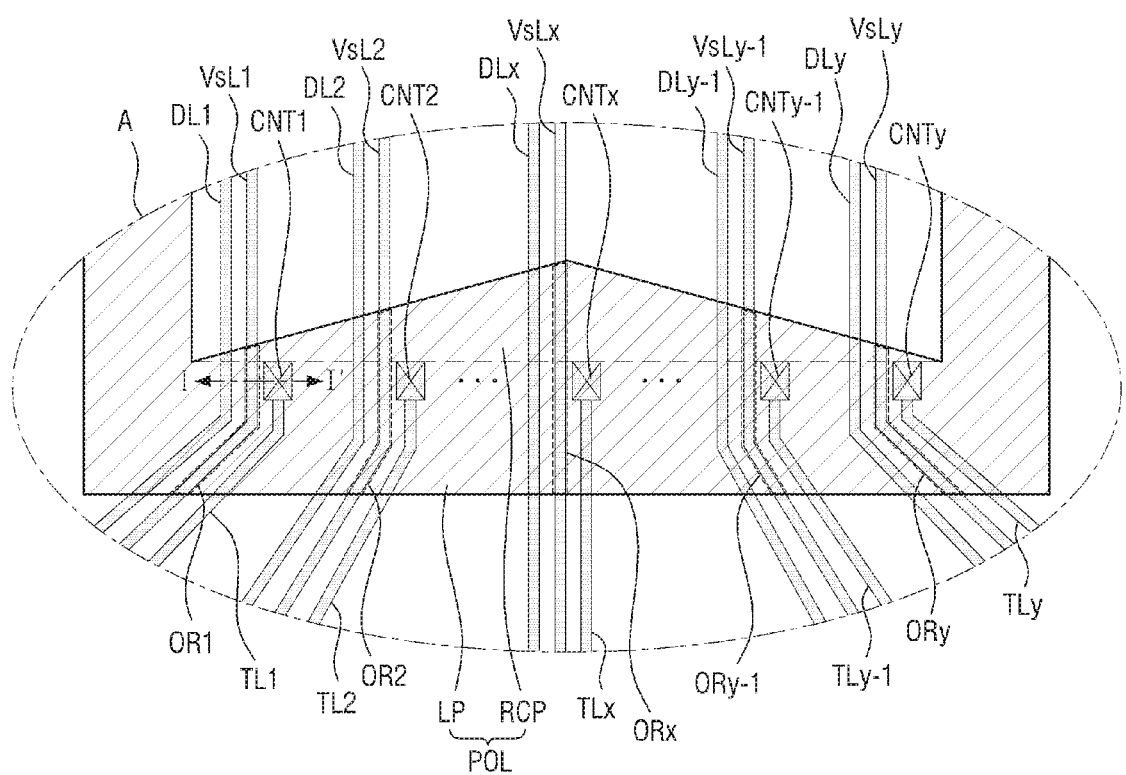
FIG. 5 is an enlarged layout view of an area A of FIG. 4.
Figure 6:
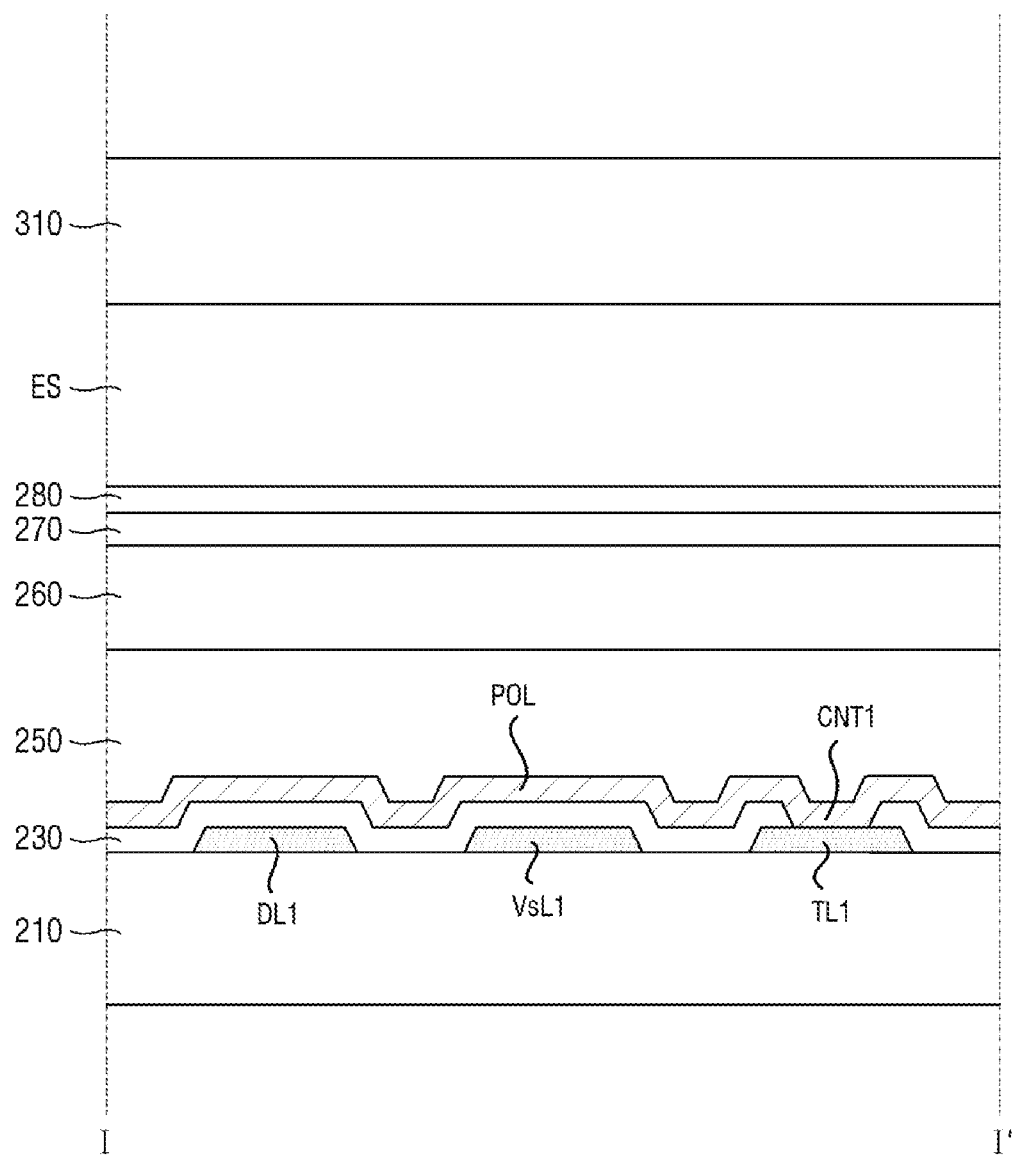
FIG. 6 is a cross-sectional view taken along line I-I' of FIG. 5.

FIG. 5 is an enlarged layout view of an area A of FIG. 4, and FIG. 6 is a cross-sectional view taken along line I-I' of FIG. 5.

The area A of FIG. 5 has a slightly different shape from the area A of FIG. 4 because FIG. 4 is a schematic view of the entire organic light-emitting display device 10, whereas FIG. 5 is a partial view of the organic light-emitting display device 10. It is noted that the structure illustrated in FIG. 5 better reflects the actual structure of the organic light-emitting display device 10.

Referring to FIGS. 5 and 6, the organic light-emitting display device 10 includes a first base substrate 210, a plurality of data lines DL1, DL2, ..., DLx, ..., DLy−1, DLy, a plurality of sensing lines VsL1, VsL2, ..., VsLx, ..., VsLy−1, VsLy, a plurality of transmission lines TL1, TL2, ..., TLx, ..., TLy−1, TLy, a first insulating layer 230, the power line POL, a second insulating layer 250, and a second base substrate 310.

The data lines DL1, DL2, ..., DLx, ..., DLy−1, DLy, the sensing lines VsL1, VsL2, ..., VsLx, ..., VsLy−1, VsLy, the transmission lines TL1, TL2, ..., TLx, ..., TLy−1, TLy, a plurality of contact holes CNT1, CNT2, ..., CNTx, ..., CNTy−1, CNTy, and the power line POL are disposed on the first base substrate 210 between the display area DA and the pad portions PR provided in the non-display area NDA.

The data lines DL1, DL2, ..., DLx, ..., DLy−1, DLy, the sensing lines VsL1, VsL2, ..., VsLx, ..., VsLy−1, VsLy, and the transmission lines TL1, TL2, ..., TLx, ..., TLy−1, TLy may transmit signals provided by ICs mounted on the pad portions PR to the pixels PX in the display area DA.

Signals provided to the data lines DL1, DL2, ..., DLx, ..., DLy−1, DLy may be some of the data signals D1, D2, ..., Dm of FIG. 1.

Also, signals provided to the sensing lines VsL1, VsL2, ..., VsLx, ..., VsLy−1, VsLy may be the sensing voltage Vs of FIG. 1. FIG. 1, which is a block diagram of the organic light-emitting display device 10, illustrates that the data signals D1, D2, ..., Dm and the sensing voltage Vs are applied from opposite sides of the display unit 110, but the data signals D1, D2, ..., Dm and the sensing voltage Vs may both be applied from one side of the display area DA, as illustrated in FIGS. 4 and 5.

Although not specifically illustrated, each of the data lines DL1, DL2, ..., DLx, ..., DLy−1, DLy may include a zigzag section extending in a zigzag fashion, and each of the sensing lines VsL1, VsL2, ..., VsLx, −1, VsLy may also include a zigzag section extending in a zigzag fashion. Due to the zigzag sections of the data lines DL1, DL2, ..., DLx, ..., DLy−1, DLy, any differences in resistance among the data lines DL1, DL2, ..., DLx, ..., DLy−1, DLy can be eliminated or minimized. Also, due to the zigzag sections of the sensing lines VsL1, VsL2, ..., VsLx, −1, VsLy, any differences in resistance among the sensing lines VsL1, VsL2, ..., VsLx, −1, VsLy can be eliminated or minimized. At least some of the zigzag sections of the sensing lines VsL1, VsL2, ..., VsLx, −1, VsLy may be disposed not to overlap with the power line POL, which will be described later. In this case, the areas of overlap between the sensing lines VsL1, VsL2, ..., VsLx, ..., VsLy−1, VsLy and the power line POL are likely to differ from one another.

Signals provided to the transmission lines TL1, TL2, ..., TLx, ..., TLy−1, TLy may be one of the first power supply voltage ELVDD and the second power supply voltage ELVSS of FIG. 1. The first power supply voltage ELVDD and the second power supply voltage ELVSS may be provided to the transmission lines TL1, TL2, ..., TLx, ..., TLy−1, TLy via the power line POL.

The data lines DL1, DL2, ..., DLx, ..., DLy−1, DLy, the sensing lines VsL1, VsL2, ..., VsLx, ..., VsLy−1, VsLy, and the transmission lines TL1, TL2, ..., TLx, ..., TLy−1, TLy may extend to form a fan shape that widens in a downward direction in the view of FIG. 5 in consideration that an area in which a number of pixels PX controlled by each of the pad portions PR are arranged is larger than the width of the pad portions PR.

The data lines DL1, DL2, ..., DLx, ..., DLy−1, DLy, the sensing lines VsL1, VsL2, ..., VsLx, ..., VsLy−1, VsLy, the transmission lines TL1, TL2, ..., TLx, ..., TLy−1, TLy, and the contact holes CNT1, CNT2, ..., CNTx, ..., CNTy−1, CNTy may respectively form unit groups and may extend toward the display area DA. Specifically, the first data line DL1, the first sensing line VsL1, and the first transmission line TL1 may be sequentially arranged at the far left of FIG. 5, and the second data line DL2, and the second sensing line VsL2, and the second transmission line TL2 may be sequentially arranged on the right of a unit group formed by the first data line DL1, the first sensing line VsL1, and the first transmission line TL1.

The closer the conductive lines ML are to the left or right of FIG. 5, the higher the degree to which the conductive lines ML are bent toward the display area DA, and the closer the conductive lines ML are to the center of FIG. 5, the more the conductive lines ML extend straight. Specifically, the first data line DL1, the first sensing line VsL1, and the first transmission line TL1, which are located at the far left of FIG. 5, and the y-th data line DLy, the y-th sensing line VsLy, and the y-th transmission line TLy, which are located at the far right of FIG. 5, are bent toward the display area DA to a highest degree. The x-th data line DLx, the x-th sensing line VsLx, and the x-th transmission line TLx, which are disposed at the center of FIG. 5, may extend straight from the top to the bottom of FIG. 5.

The first insulating layer 230 is disposed on the data lines DL1, DL2, ..., DLx, ..., DLy−1, DLy, the sensing lines VsL1, VsL2, ..., VsLx, ..., VsLy−1, VsLy, and the transmission lines TL1, TL2, ..., TLx, ..., TLy−1, TLy. The first insulating layer 230 may insulate the power line POL, which is disposed above the first insulating layer 230, from the data lines DL1, DL2, ..., DLx, ..., DLy−1, DLy and the sensing lines VsL1, VsL2, ..., VsLx, ..., VsLy−1, VsLy, which are disposed below the first insulating layer 230. The first insulating layer 230 may include an organic film and/or an inorganic film.

The power line POL is disposed on the first insulating layer 230. The power line POL may receive the first power supply voltage ELVDD or the second power supply voltage ELVSS directly from the power supply unit 170 of FIG. 1. The first power supply voltage ELVDD or the second power supply voltage ELVSS may be provided to the transmission lines TL1, TL2, ..., TLx, ..., TLy−1, TLy via the contact holes CNT1, CNT2, ..., CNTx, ..., CNTy−1, CNTy, which are formed to penetrate the first insulating layer 230.

The power line POL may include a line portion LP and an area compensating portion RCP. The line portion LP is a portion extending along a direction in which the power line POL extends without having no particular pattern, and the area compensating portion RCP is a portion extending variably in a direction different from the direction in which the power line POL extends. In other words, the area compensating portion RCP is illustrated as extending in a direction different from the direction in which the power line POL extends, but the present disclosure is not limited thereto.

Specifically, in the view of FIG. 5, the line portion LP may extend in an angular "U" shape. In other words, in the view of FIG. 5, the line portion LP may be formed to extend in a "U" shape, but the present disclosure is not limited thereto. That is, the line portion LP may be formed in a shape other than that set forth in FIG. 5, especially when the line portion LP is formed to overlap with the contact holes CNT1, CNT2, ..., CNTx, ..., CNTy−1, CNTy. For example, the line portion LP may be formed as a straight line extending in a horizontal direction in the view of FIG. 5.

The area compensating portion RCP may be expanded from the line portion LP in a direction in which the sensing lines VsL1, VsL2, ..., VsLx, ..., VsLy−1, VsLy extend.

For example, as illustrated in FIG. 5, the area compensating portion RCP may be formed in a triangular shape.

The areas of overlap between the sensing lines VsL1, VsL2, ..., VsLx, ..., VsLy−1, VsLy and the line portion LP may differ from one another. The area compensating portion RCP may compensate for the areas of overlap between the sensing lines VsL1, VsL2, ..., VsLx, ..., VsLy−1, VsLy and the line portion LP such that the areas of overlap between the sensing lines VsL1, VsL2, ..., VsLx, ..., VsLy−1, VsLy and the power line POL can become identical. In other words, the smaller the areas of overlap between the sensing lines VsL1, VsL2, ..., VsLx, ..., VsLy−1, VsLy and the line portion LP, the larger the areas of overlap between the sensing lines VsL1, VsL2, ..., VsLx, ..., VsLy−1, VsLy and the area compensating portion RCP.

Specifically, the first sensing line VsL1, which is located at the far left of FIG. 5, and the power line POL form a first overlap region OR1. The second sensing line VsL2 and the power line POL form a second overlap region OR2, the x-th sensing line VsLx and the power line POL form an x-th overlap region ORx, the (y−1)-th sensing line VsLy−1 and the power line POL form a (y−1)-th overlap region ORy−1, and the y-th sensing line VsLy and the power line POL form a y-th overlap region ORy. The overlap regions OR1, OR2, ..., ORx, ..., ORy−1, ORy may all have the same area.

The expression "the overlap regions OR1, OR2, ..., ORx, ..., ORy−1, ORy having the same area", as used herein, does not necessarily mean that the overlap regions OR1, OR2, ..., ORx, ..., ORy−1, ORy all have completely the same area, but rather means that the overlap regions OR1, OR2, ..., ORx, ..., ORy−1, ORy have almost the same area such that differences among capacitances formed by the first through y-th sensing lines VsL1 through VsLy overlapping with the power line POL can almost be zeroed.

Most of the first overlap region OR1 may overlap with the line portion LP, and the ratio of the area of overlap between the first overlap region OR1 and the area compensating portion RCP to the entire area of the first overlap region OR1 may be very small. The ratio of the area of overlap between the x-th overlap region ORx and the area compensating portion RCP to the entire area of the x-th overlap region ORx may be greater than the ratio of the area of overlap between the first overlap region OR1 and the area compensating portion RCP to the entire area of the first overlap region OR1. By controlling the areas of overlap between the sensing lines VsL1, VsL2, ..., VsLx, ..., VsLy−1, VsLy and the area compensating portion RCP, the overlap regions OR1, OR2, ..., ORx, ..., ORy−1, ORy may all be made to have the same area.

The sensing lines VsL1, VsL2, ..., VsLx, ..., VsLy−1, VsLy and the power line POL are spaced apart with the first insulating layer 230 interposed therebetween and may thus form capacitances therebetween. As described above, if the areas of overlap between the sensing lines VsL1, VsL2, ..., VsLx, ..., VsLy−1, VsLy and the power line POL including the area compensating portion RCP are controlled to be all identical, the capacitances that the sensing lines VsL1, VsL2, ..., VsLx, ..., VsLy−1, VsLy form with the power line POL may all become identical because they are proportional to the areas of overlap between the sensing lines VsL1, VsL2, ..., VsLx, ..., VsLy−1, VsLy and the power line POL including the area compensating portion RCP. Thus, error that may be caused by differences in capacitance can be minimized. Specifically, if resistance is maintained to be uniform among the sensing lines VsL1, VsL2, ..., VsLx, ..., VsLy−1, VsLy and the capacitances that the sensing lines VsL1, VsL2, ..., VsLx, ..., VsLy−1, VsLy form with the power line POL are all made to be identical, no RC delays may occur. As a result, the reliability of deterioration information extracted via the sensing lines VsL1, VsL2, ..., VsLx, ..., VsLy−1, VsLy can be improved.

The second insulating layer 250 is disposed on the power line POL. The second insulating layer 250 may insulate elements (not illustrated) disposed on the second insulating layer 250 from the power line POL and may comprise an organic material and/or an inorganic material. The elements disposed on the second insulating layer 250 may be already-known elements necessary for driving the pixels PX, and thus, a detailed description thereof will be omitted. The elements disposed on the second insulating layer 250 are illustrated in FIG. 6 simply as an empty space ES.

It will hereinafter be described how the area compensating portion RCP can improve the reliability of deterioration information.

Figure 7:
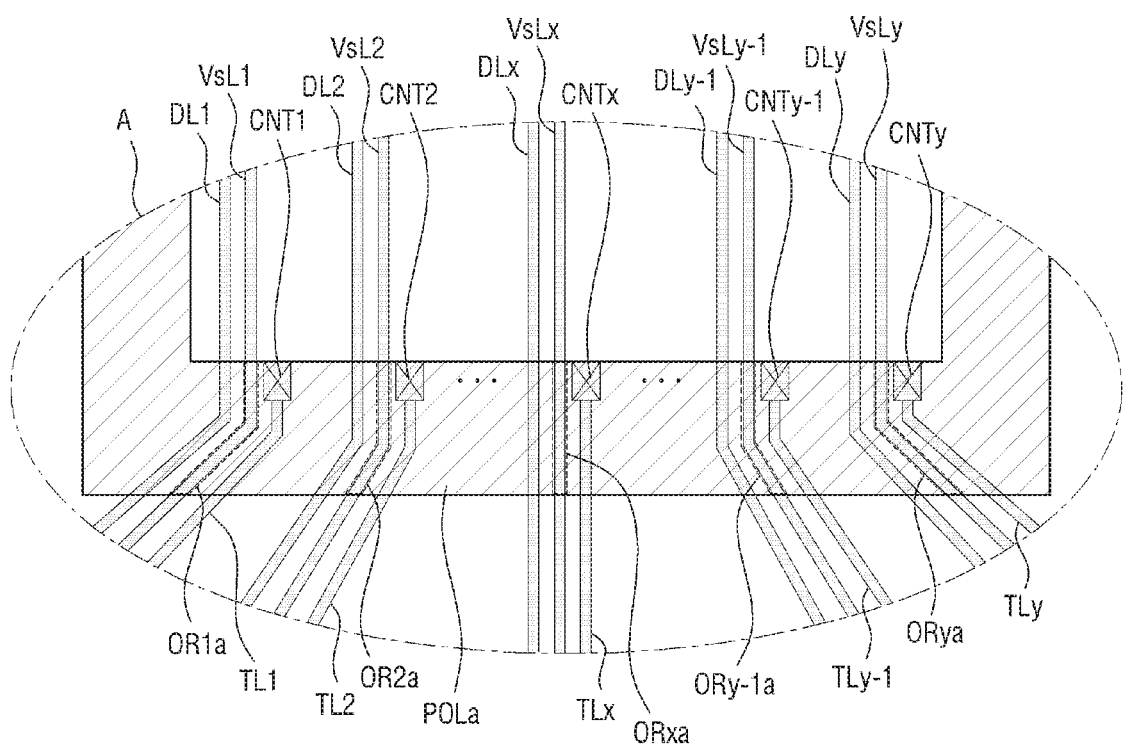
FIG. 7 is an enlarged layout view of an area A of an organic light-emitting display device according to a comparative example.

FIG. 7 is an enlarged layout view of an area A of an organic light-emitting display device according to a comparative example.

A power line POLa of an organic light-emitting display device 10 of FIG. 7, unlike the power line POL of the organic light-emitting display device 10 of FIG. 4, consists only of the line portion LP of FIG. 5 and does not include the area compensating portion RCP of FIG. 5. Data lines DL1, DL2, ..., DLx, ..., DLy−1, DLy, sensing lines VsL1, VsL2, ..., VsLx, ..., VsLy−1, VsLy, transmission lines TL1, TL2, ..., TLx, ..., TLy−1, TLy, and contact holes CNT1, CNT2, ..., CNTx, ..., CNTy−1, CNTy of FIG. 7 are the same as their respective counterparts of FIGS. 5 and 6, and thus, detailed descriptions thereof will be omitted.

Referring to FIG. 7, the areas of overlap between the sensing lines VsL1, VsL2, ..., VsLx, ..., VsLy−1, VsLy and the power line POLa may differ from one another. Specifically, the first sensing line VsL1, which is located at the far left of FIG. 7, and the power line POLa form a first overlap region OR1a. The second sensing line VsL2 and the power line POLa form a second overlap region OR2a, the x-th sensing line VsLx and the power line POLa form an x-th overlap region ORxa, the (y−1)-th sensing line VsLy−1 and the power line POLa form a (y−1)-th overlap region ORy−1a, and the y-th sensing line VsLy and the power line POLa form a y-th overlap region ORya. The overlap regions OR1a, OR2a, ..., ORxa, ..., ORy−1a, ORya, unlike their respective counterparts of FIG. 5, may have different areas.

Since the overlap regions OR1a, OR2a, ..., ORxa, ..., ORy−1a, ORya have different areas, capacitances that the sensing lines VsL1, VsL2, ..., VsLx, ..., VsLy−1, VsLy form with the power line POLa may differ from one another, which will hereinafter be described with reference to FIGS. 8 through 11.

Figure 8:
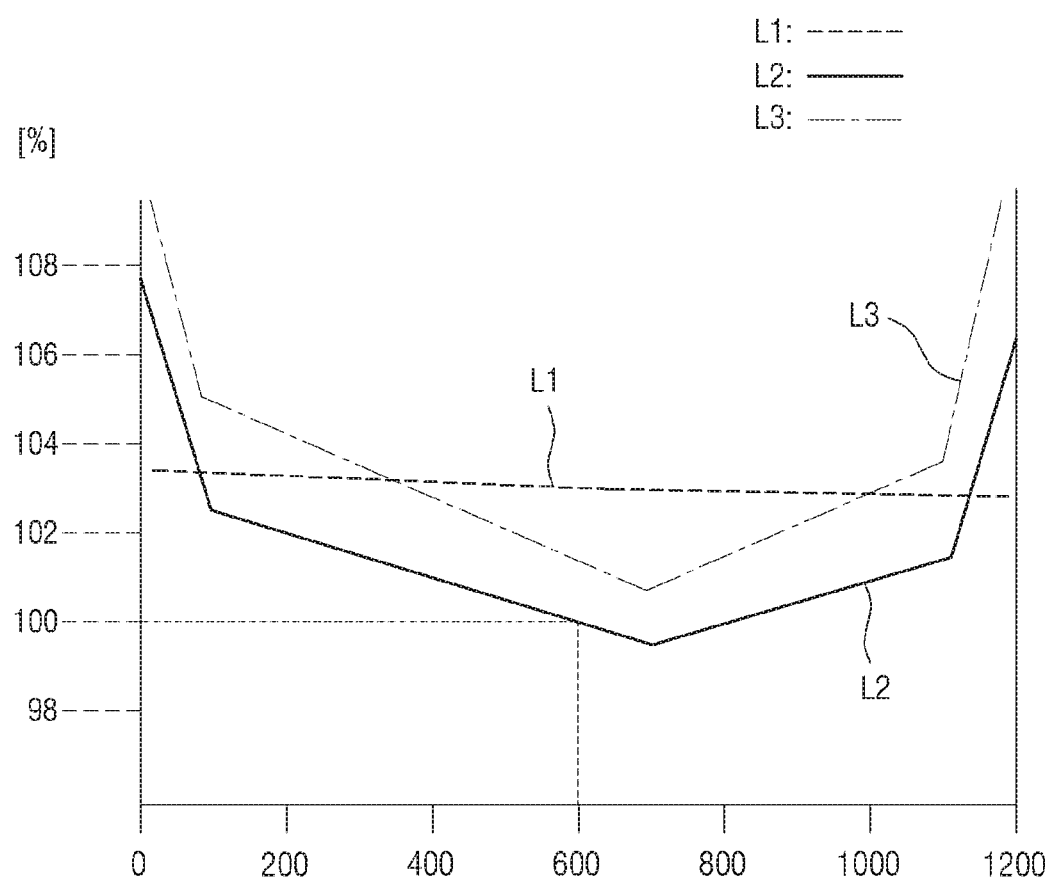
FIG. 8 is a graph showing the resistances, capacitances, and resistive-capacitive (RC) delays of sensing lines of the organic light-emitting display device of FIG. 7.
Figure 9:
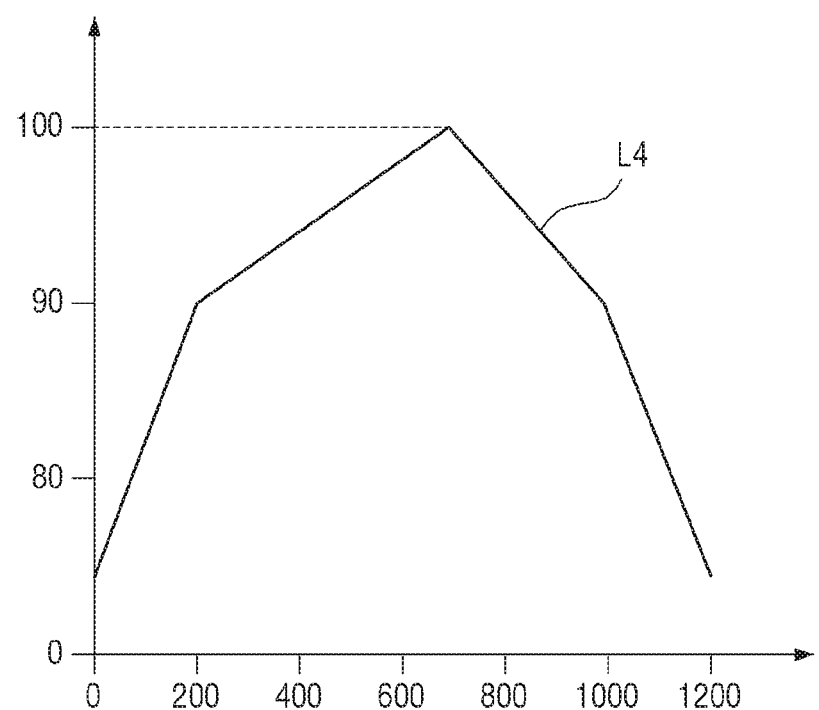
FIG. 9 is a graph showing digital values representing deterioration information of the sensing lines of the organic light-emitting display device of FIG. 7.
Figure 10:
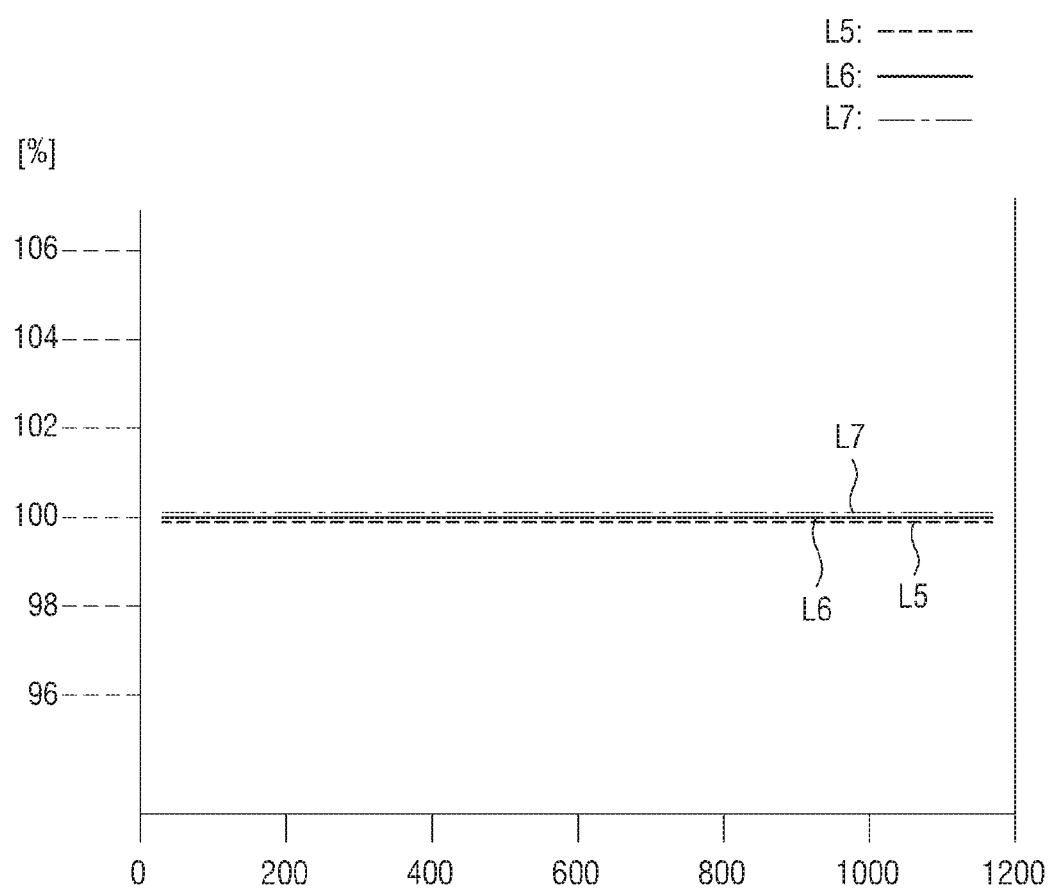
FIG. 10 is a graph showing the resistances, capacitances, and RC delays of sensing lines of the organic light-emitting display device of FIG. 5.
Figure 11:
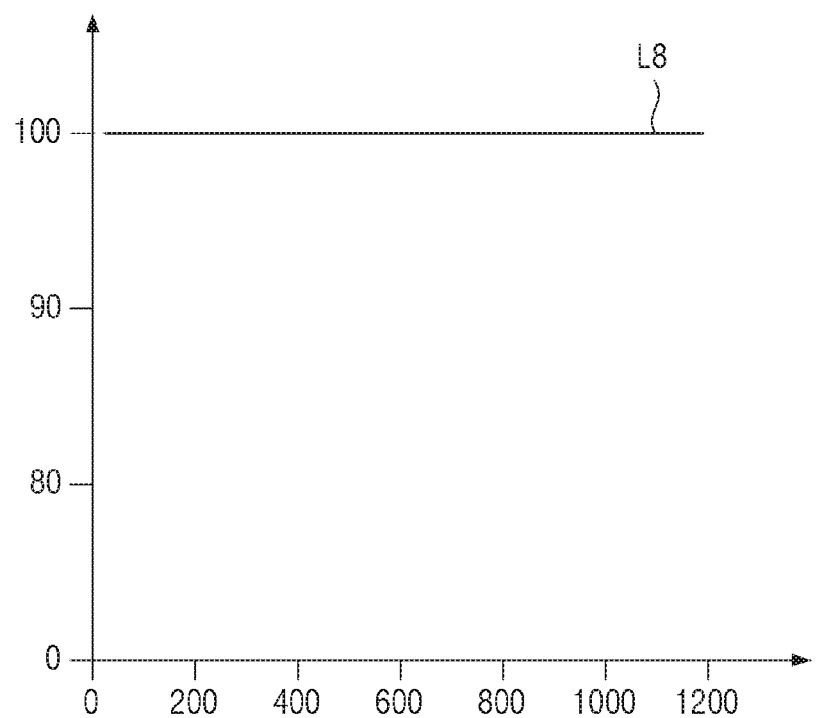
FIG. 11 is a graph showing digital values corresponding to deterioration information of the sensing lines of the organic light-emitting display device of FIG. 5.

FIG. 8 is a graph showing the resistances, capacitances, and RC delays of the sensing lines of the organic light-emitting display device of FIG. 7, FIG. 9 is a graph showing digital values corresponding to deterioration information of the sensing lines of the organic light-emitting display device of FIG. 7, FIG. 10 is a graph showing the resistances, capacitances, and RC delays of the sensing lines of the organic light-emitting display device of FIG. 5, and FIG. 11 is a graph showing digital values corresponding to deterioration information of the sensing lines of the organic light-emitting display device of FIG. 5.

Referring to FIGS. 8 through 11, the x axis represents a total of 1200 sensing lines VsL1 through VsL1200 all extending from the same pad portion PR.

Referring to FIGS. 8 and 10, the y axis represents percentage values (unit: %), and an x-axis value corresponding to a reference percentage value of 100% is set to 600. That is, a measurement obtained from the sensing line VsL600 is defined as a y-axis value of 100%, and the relative ratios of measurements obtained from the sensing lines VsL1 through VsL599 and VsL601 through VsL1200 to the measurement obtained from the sensing line VsL600 are defined as the y-axis values of the sensing lines VsL1 through VsL599 and VsL601 through VsL1200. Referring to FIG. 8, the first line L1 is a graph showing the resistances of sensing lines VsL1 through VsL1200 of the organic light-emitting display device 10 of FIG. 7, the second line L2 is a graph showing the capacitances that the sensing lines VsL1 through VsL1200 of the organic light-emitting display device 10 of FIG. 7 form with the power supply line POLa, and the third line L3 is a graph showing the RC delays of the sensing lines VsL1 through VsL1200 of the organic light-emitting display device 10 of FIG. 7. Referring to FIG. 9, the fourth line L4 is a graph showing deterioration information of the sensing lines VsL1 through VsL1200 of the organic light-emitting display device 10 of FIG. 7.

Referring to FIG. 10, the fifth line L5 is a graph showing the resistances of sensing lines VsL1 through VsL1200 of the organic light-emitting display device 10 of FIG. 5, the sixth line L6 is a graph showing the capacitances that the sensing lines VsL1 through VsL1200 of the organic light-emitting display device 10 of FIG. 5 form with the power supply line POL, and the seventh line L7 is a graph showing the RC delays of the sensing lines VsL1 through VsL1200 of the organic light-emitting display device 10 of FIG. 5. Referring to FIG. 11, the eighth line L8 is a graph showing deterioration information of the sensing lines VsL1 through VsL1200 of the organic light-emitting display device 10 of FIG. 5.

Referring to FIG. 8, even if the resistances of the sensing lines VsL1 through VsL1200 are maintained to be identical, the RC delays of the sensing lines VsL1 through VsL1200 may differ from one another when there are differences among the capacitances of the sensing lines VsL1 through VsL1200. That is, in the organic light-emitting display device 10 of FIG. 7, which does not include the area compensating portion RCP, the RC delays of the sensing lines VsL1 through VsL1200 may differ from one another. Referring to FIG. 9, due to the differences among the RC delays of the sensing lines VsL1 through VsL1200, deterioration information also differs among the sensing lines VsL1 through VsL1200. Here, it is assumed that the degree of deterioration of the OLED "EL" of FIG. 2, from which deterioration information is obtained, is identical throughout all the pixels PX.

On the other hand, referring to FIG. 10, in a case where the resistances of the sensing lines VsL1 through VsL1200 are maintained to be identical and the capacitances of the sensing lines VsL1 through VsL1200 do not much differ from one another, the RC delays of the sensing lines VsL1 through VsL1200 also do not much differ from one another. Also, referring to FIG. 11, since the RC delays of the sensing lines VsL1 through VsL1200 do not much differ from one another, deterioration information measured is almost uniform throughout the sensing lines VsL1 through VsL1200. In other words, in a case where the power line POL of FIG. 5, which is includes both the line portion LP and the area compensating portion RCP, is used, there are almost no differences in deterioration information measured among the sensing lines VsL1 through VsL1200, and as a result, deterioration compensation can be performed precisely.

Figure 12:
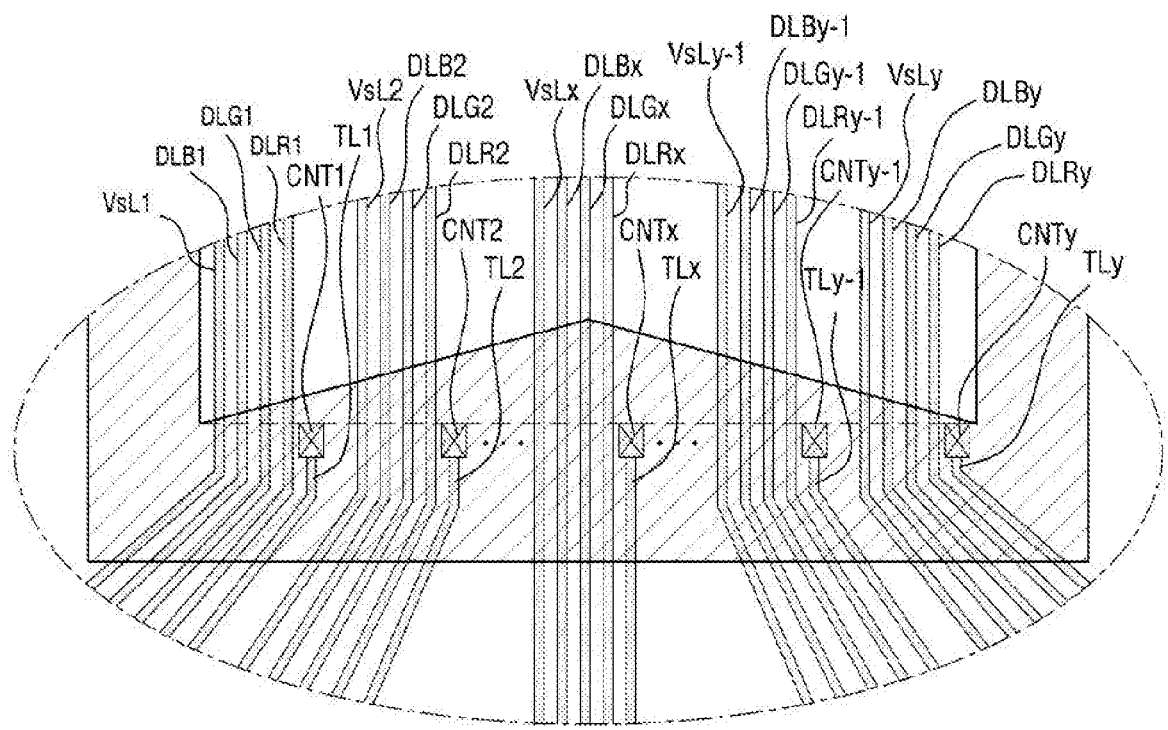
FIG. 12 is an enlarged layout view of an area A of an organic light-emitting display device according to another exemplary embodiment of the present disclosure.

FIG. 12 is an enlarged layout view of an area A of an organic light-emitting display device according to another exemplary embodiment of the present disclosure.

The organic light-emitting display device of FIG. 12 includes a plurality of groups of three data lines, i.e., a plurality of red data lines DLR1, DLR2, ..., DLRx, ..., DLRy−1, DLRy, a plurality of green data lines DLG1, DLG2, ..., DLGx, ..., DLGy−1, DLGy, and a plurality of blue data lines DLB1, DLB2, ..., DLBx, ..., DLBy−1, DLBy that are paired with one another, whereas the organic light-emitting display device 10 of FIG. 5 includes the data lines DL1, DL2, ..., DLx, ..., DLy−1, DLy. A plurality of sensing lines VsL1, VsL2, ..., VsLx, ..., VsLy−1, VsLy, a plurality of transmission lines TL1, TL2, ..., TLx, ..., TLy−1, TLy, a plurality of contact holes CNT1, CNT2, ..., CNTx, ..., CNTy−1, CNTy, and a power line POL of FIG. 12 are the same as their respective counterparts of FIG. 5, and thus, detailed descriptions thereof will be omitted.

Referring to FIG. 12, a total of three data lines, for example, the red, green, and blue data lines DLR1, DLG1, and DLB1, one sensing line, for example, the sensing line VsL1, and one transmission line, for example, the transmission line TL1, may be paired together and may be provided for a number of pixels (not illustrated).

The power line POL may include a line portion LP and an area compensating portion RCP, and capacitances that the sensing lines VsL1, VsL2, . . . , VsLx, . . . , VsLy−1, VsLy form with the power line POL may be maintained to be identical. Accordingly, there are no differences in deterioration information obtained by the sensing lines VsL1, VsL2, . . . , VsLx, . . . , VsLy−1, VsLy, and as a result, deterioration compensation can be performed precisely.

However, the effects of the inventive concept are not restricted to the one set forth herein. The above and other effects of the inventive concept will become more apparent to one of daily skill in the art to which the inventive concept pertains by referencing the claims.

What is claimed is:

1. An organic light-emitting display device, comprising:
    a plurality of scan lines;
    a plurality of sensing control lines;
    a plurality of data lines;
    a sensing unit coupled with a plurality of sensing lines, the plurality of sensing lines being disposed on a same layer as the data lines, the plurality of sensing lines including first and second sensing lines;
    an insulating layer disposed on the data lines and the first and second sensing lines;
    a power line disposed on the insulating layer, the insulating layer being interposed between the plurality of sensing lines and the power line;
    a plurality of organic light emitting diodes disposed in a display area; and
    a plurality of transistors, each of the plurality of transistors including a gate electrode electrically connected to one of the plurality of sensing control lines, a first electrode electrically connected to the first sensing line, and a second electrode electrically connected to one of the plurality of organic light emitting diodes,
    wherein an area of a first area of overlap between the first sensing line and the power line is the same as an area of a second area of overlap between the second sensing line and the power line, wherein the first area and the second area are disposed in a non-display area, wherein a bent angle of the first sensing line in the first area is different from a bent angle of the second sensing line in the second area, wherein sensing data about any deterioration of the plurality of organic light emitting diodes is configured to be transmitted via the plurality of sensing lines, wherein a capacitance formed between the first sensing line and the power line is identical to a capacitance formed between the second sensing line and the power line.

2. The organic light-emitting display device of claim 1, wherein a resistance of the first sensing line is the same as a resistance of the second sensing line.

3. The organic light-emitting display device of claim 1, wherein a resistive-capacitive (RC) delay in a signal configured to be transmitted via the first sensing line is the same as an RC delay in a signal configured to be transmitted via the second sensing line.

4. The organic light-emitting display device of claim 1, wherein a variation in a direction in which the first sensing line extends in a region of overlap between the first sensing line and the power line is smaller than a variation in a direction in which the second sensing line extends in the region of overlap between the second sensing line and the power line.

5. The organic light-emitting display device of claim 4, wherein the first sensing line is formed as a straight line in the region of overlap between the first sensing line and the power line.

6. The organic light-emitting display device of claim 4, wherein
    the power line includes a line portion and an area compensating portion, which is placed in contact with the line portion and is formed of a same material as, and on a same layer as, the line portion, and
    the area compensating portion is expanded from the line portion in the direction in which the first sensing line extends.

7. The organic light-emitting display device of claim 6, wherein the power line has a largest width in the direction in which the first sensing line extends in the region of overlap between the first sensing line and the power line.

8. The organic light-emitting display device of claim 6, wherein an area of overlap between the first sensing line and the area compensating portion is larger than an area of overlap between the second sensing line and the area compensating portion.

9. The organic light-emitting display device of claim 8, wherein an area of overlap between the first sensing line and the line portion is smaller than an area of overlap between the second sensing line and the line portion.

10. The organic light-emitting display device of claim 6, wherein the area compensating portion is triangular.

11. The organic light-emitting display device of claim 1, further comprising:
    a plurality of transmission lines disposed on the same layer as the data lines and the first and second sensing lines,
    wherein the transmission lines are connected to the power line via contact holes, which are formed in the insulating layer.

12. The organic light-emitting display device of claim 1, wherein at least one of the pixels is electrically connected to at least one of the data lines, one of the first and second sensing lines, and the power line.

13. The organic light-emitting display device of claim 1, wherein the plurality of sensing lines and the plurality of data lines are disposed directly on the same layer.

14. An organic light-emitting display device, comprising:
    a plurality of scan lines;
    a plurality of sensing control lines;
    a plurality of data lines;
    a sensing unit coupled with a plurality of sensing lines, the plurality of sensing lines being disposed on a same layer as the data lines, the plurality of sensing lines including first and second sensing lines;
    an insulating layer disposed on the data lines and the first and second sensing lines; and
    a power line disposed on the insulating layer, the insulating layer being interposed between the plurality of sensing lines and the power line;
    a plurality of organic light emitting diodes disposed in a display area; and
    a plurality of transistors, each of the plurality of transistors including a gate electrode electrically connected to one of the plurality of sensing control lines, a first electrode electrically connected to the first sensing line, and a second electrode electrically connected to one of the plurality of organic light emitting diodes,
    wherein
    the second sensing line extends to be bent,
    the first sensing line extends in one direction, the power line disposed in a non-display area has a wider width in a direction perpendicular to a direction in which the power line extends in a region of overlap between the first sensing line and the power line than in a region of overlap between the second sensing line and the power line, wherein sensing data about any deterioration of the plurality of organic light emitting diodes is configured to be transmitted via the plurality of sensing lines, wherein a capacitance formed between the first sensing line and the power line is identical to a capacitance formed between the second sensing line and the power line.

15. The organic light-emitting display device of claim 14, wherein an RC delay in a signal configured to be transmitted via the first sensing line is the same as an RC delay in a signal configured to be transmitted via the second sensing line.

16. The organic light-emitting display device of claim 14, wherein a variation in a direction in which the first sensing line extends in the region of overlap between the first sensing line and the power line is smaller than a variation in a direction in which the second sensing line extends in the region of overlap between the second sensing line and the power line.

* * * * *